(12) United States Patent
Beach et al.

(10) Patent No.: US 9,049,777 B2
(45) Date of Patent: Jun. 2, 2015

(54) EMI SHIELDED THERMOSET ARTICLE

(75) Inventors: Brian A. Beach, Long Beach, CA (US); Thomas Atkins, Newport Beach, CA (US)

(73) Assignee: Plastics Research Corporation, Ontario, CA (US)

( * ) Notice: Subject to any disclaimer, the term of this patent is extended or adjusted under 35 U.S.C. 154(b) by 0 days.

(21) Appl. No.: 13/285,523

(22) Filed: Oct. 31, 2011

(65) Prior Publication Data

US 2012/0107538 A1    May 3, 2012

Related U.S. Application Data

(60) Provisional application No. 61/408,922, filed on Nov. 1, 2010.

(51) Int. Cl.
 *H05K 9/00* (2006.01)
 *H01B 1/22* (2006.01)

(52) U.S. Cl.
 CPC ............. *H05K 9/0047* (2013.01); *H01B 1/22* (2013.01)

(58) Field of Classification Search
 CPC .............................. H05K 9/0047; H01B 1/22
 USPC ........................................ 524/211; 428/35.8
 See application file for complete search history.

(56) References Cited

U.S. PATENT DOCUMENTS

| | | | |
|---|---|---|---|
| 4,689,098 A | | 8/1987 | Gaughan |
| 6,013,203 A | * | 1/2000 | Paneccasio et al. ........... 252/512 |
| 6,902,688 B2 | * | 6/2005 | Narayan et al. ............... 252/512 |
| 7,005,573 B2 | | 2/2006 | Lionetta et al. |
| 2004/0028859 A1 | * | 2/2004 | LeGrande et al. ......... 428/36.91 |
| 2004/0220327 A1 | * | 11/2004 | Cosman et al. ................ 524/779 |
| 2008/0281014 A1 | * | 11/2008 | Momose et al. ................ 522/71 |
| 2010/0018765 A1 | * | 1/2010 | Suenaga et al. ............... 174/389 |
| 2011/0067918 A1 | | 3/2011 | Whu et al. |

* cited by examiner

*Primary Examiner* — John Uselding
(74) *Attorney, Agent, or Firm* — Avery N. Goldstein, Esq.; Blue Filament Law PLLC

(57) ABSTRACT

A conductive thermoset material is provided that provides shielding against electromagnetic radiation. The conductive thermoset material includes an intermixed conductive material dispersed essentially throughout. An antisettling additive is present in the conductive thermoset material to support dispersion, optionally, homogenous dispersion of the conductive material in the resin. The conductive thermoset material is formable into one or more articles. The articles may be transportable and resistant to significant conductivity changes by contact with other surfaces.

7 Claims, No Drawings

EMI SHIELDED THERMOSET ARTICLE

RELATED APPLICATION

This application claims priority of U.S. Provisional Patent Application Ser. No. 61/408,922 filed Nov. 1, 2010.

FIELD OF THE INVENTION

The present invention relates to shielding against electromagnetic radiation, and in particular conductive thermoset materials and articles are provided that shield against electromagnetic radiation.

BACKGROUND OF THE INVENTION

Shielding of electronic articles is becoming increasingly important with the continued expansion and use of proximally located electronic equipment. All electronic equipment emits electromagnetic radiative or conductive energy which may produce electromagnetic interference (EMI). The presence of EMI from proximal electronic sources is particularly problematic for highly sensitive electronic equipment such as that found in targeting systems and electronic systems used for space flight.

Generally two methods are used for protecting electronic equipment from EMI. The simple process of identifying non-compatible proximal or distant radiative sources and removing them or increasing their distance was a typical method of protection. The method of avoiding or removing EMI sources is not available when a sensitive electronic device is mobile and it is not possible to predict the environment in which the device will be used.

The second method is to provide a conductive shielding that is electrically grounded to direct electronic energy away from the article to be protected. Many methods of shielding against EMI have been introduced including a conductive mesh or grid that is layered on a structural substrate. These methods are illustratively found in U.S. Patent Application Publication 2007/0084631, the contents of which are incorporated herein by reference. Metalized fabrics where one or more metal coatings are layered on a woven, nonwoven, or open mesh carrier backing or substrate has also been proposed as described in U.S. Pat. Nos. 4,900,618; 4,910,072; 5,075,037; 5,393,928; and 6,652,777, the contents of each of which are incorporated herein by reference. Finally, coatings such as conductive inks can be applied to a film or flexible or solid substrate. Water-based conductive inks for these purposes are illustratively found in U.S. Pat. Nos. 5,286,415 and 5,389,403 the contents of each of which are incorporated herein by reference.

Each of the prior materials and processes are inadequate for use in transportable shielding articles where ruggedness, low weight, and adequate shielding are desirable. The coatings are susceptible to scratching, denting, or other deformation altering their conductive abilities and creating gaps in any shielding that may allow both ingress and egress of electromagnetic energy. These gaps, dents, or damaged sections may also compromise the efficiency of the connection to ground.

Thus, there exists a need for materials and articles that are structurally operable, transportable, and have reduced susceptibility to damage.

SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

A conductive thermoset material is provided that provides shielding against electromagnetic radiation. The material is formable into one or more articles. The articles may be transportable and resistant to significant conductivity changes by contact with other surfaces.

DETAILED DESCRIPTION OF THE PREFERRED EMBODIMENTS

The following description of the preferred embodiment(s) is merely exemplary in nature and is in no way intended to limit the scope of the invention, its application, or uses, which may, of course, vary. The invention is described with relation to the non-limiting definitions and terminology included herein. These definitions and terminology are not designed to function as a limitation on the scope or practice of the invention but are presented for illustrative and descriptive purposes only.

The invention has utility as material for shielding against electromagnetic interference (EMI) due to a radiative or conductive source of electromagnetic energy. It is to be appreciated that EMI is both interference from electronic energy and radiofrequency energy.

A conductive thermoset material is provided where a thermoset resin includes an intermixed conductive material dispersed essentially throughout. An antisettling additive is present in the material to support dispersion, optionally, homogenous dispersion of the conductive material in the resin. The material optionally has an EMI shielding effectiveness of 50 db or less as measured by ASTM D4935, the contents of which are incorporated herein by reference.

A thermoset material is optionally an epoxy, polyester, vinylester, polyurethane, or phenolic resin. The molecular weight of the preformed resins is between 400 and 10,000 Daltons on average. Sources of resins are known in the art. Illustratively, resin materials are available from Dow Chemical Company. Illustrative examples of resins include polyethylene, polypropylene, polystyrene, polyester, and polyamide. Suitable resins are optionally disclosed in U.S. Pat. No. 6,780,923, the contents of which are incorporated herein by reference.

A thermoset material is a mixture of a polymeric resin prepolymer and one or more ethylenically unsaturated monomers that copolymerize with the prepolymer to form a thermoset material. Examples of ethylenically unsaturated monomers illustratively include styrene, alpha-methylstyrene, vinyltoluene, chlorostyrene, (meth)acrylic acid, alkyl (meth) acrylates, acrylonitrile, vinyl acetate, allyl acetate, triallyl cyanurate, triallyl isocyanurate, and acrylamide. A polymerizable monomer is optionally a liquid or solid monomer. Illustratively, a solid monomomer operative herein is diacetone acrylamide. A solid monomer is optionally used alone or in combination with a liquid monomer. It is appreciated that a resin and monomer are polymerized to form a solid thermoset material that is not thermoplastic.

An electromagnetic interference shielding material includes a conductive material. Typical conductive polymeric materials included carbon black as a conductive additive. It was surprisingly discovered that carbon black and other traditional additives were unable to be added to a thermoset resin at sufficient concentrations to both provide sufficient EMI shielding and allow for sufficient structural characteristics of the final polymerized material such as resistance to fracture, and compressive strength. Thus, embodiments of the electromagnetic interference shielding material exclude carbon black. It was further and unexpectedly discovered that other conductive additives such as spheres, rods, fibers, or other when present alone could not be included at sufficient percolation threshold to produce an article with sufficient shielding and structural requirements. A mixture of spheres and rods or fibers at particular ratios did unexpectedly provide a structurally desirable thermoset material with sufficient shielding characteristics.

The thermoset materials of the present invention also include conductive particles (e.g., conductive metal particles) dispersed in the thermoset resin. Examples of suitable conductive metal particles include metal powders, metal flakes, metal-coated beads, and combinations thereof. The conductive metal particles can include any suitable metal, such as aluminum, silver, gold, copper, and mixtures, alloys, and other combinations thereof. The conductive particles can be non-metallic, for example, as in the case where the conductive particles are made from or otherwise contain conductive polymeric materials. Specific examples of suitable conductive particles include silver flake, silver nanopowder, silver acorn, and silver-coated beads, such as silver-coated glass beads.

Conductive particles are optionally homogenously dispersed throughout the material so as to provide uniform conductance throughout.

A conductive material illustratively includes conductive spheres. Illustrative examples of conductive spheres include conductive microballoons, plated glass microspheres, or hollow microspheres. The conductive material on a sphere or incorporated into the material of the sphere is optionally a metal with a metal with a bulk resistivity of $10^{-5}$ ohms/cm or less. Illustrative examples of metals include copper, aluminum, silver, and nickel. In some embodiments, a microballoon, or microsphere is coated with a conductive polymer material such as poly-Analine. Spheres, are appreciated to be essentially spherical in shape. Other shapes with other than circular cross sections are similarly envisioned to be included under the term spheres illustratively including cross sectional ovals or polygons. In some embodiments a microsphere has an average diameter of 14 micrometers. Illustratively, silver coated microspheres are available from Potters Industries.

The electromagnetic interference shielding material includes one or more rods of conductive material. Illustrative examples of conductive rods include sintered metal particles, conductive polymers, metalized polymer fibers, metalized carbon fibers, or combinations thereof. It is appreciated that a rod is not carbon black. Conductive rods or fibers are optionally stainless steel fibers available from Baeckert, Naslon—SUS316L from Nippon Seisen Co. of Osaka-City, Japan, Panex Chopped Fiber—PX33CF1000-01 from Zoltex Corporation of St. Louis, Mo., and X-Static Silver Nylon Fiber from Instrument Specialties of Scranton, Pa. Pure component fibers are optionally used. Such pure component fibers have a bulk resistivity at or below about the values for metal coated fibers. In addition, some other conductive materials that can be used are silver loaded particles, silver/copper flake, silver/nylon fiber, silver carbon fibers, tin over copper flash, and tin.

EMI shielding effectiveness is illustratively determined by ASTM D4935 (TEM cell method), or for higher frequency range, a modified IEEE 299 test procedure for SE (antenna-to-antenna method). The contents of these methods are incorporated herein by reference.

An electromagnetic interference shielding material includes an antisettling agent. An antisettling agent is a suspension or rheological additive that promotes the dispersion of conductive material in a thermoset resin. A rheology modifier is illustratively a urea or modified urea. An exemplary rheology modifier is BYK-410 available from BYK-Chemie GmbH, Germany.

A thermoset electromagnetic interference shielding material optionally includes one or more additives. An additive is typically present at levels and using additive materials typically known in the art. An additive is illustratively a reaction kinetic modifier, mold release agent (e.g. oleates-, palmitates-, stearates- of metal ions such as sodium, zinc, calcium, magnesium, and lithium, if present, typically at 5 percent by weight or less), plasticizer, flame retardant, thickener, colorant, filler, or combinations thereof. Illustrative examples of a reaction kinetic modifier include: free radical initiators such as peroxide/peroxy ketals and azo compounds; and a polymerization inhibitor such as hydroquinone. Illustrative examples of fillers include: particulate fillers such as calcium carbonate or alumina; and fiber fillers such as glass. A low profile additive is optionally present such as an ethyleneically saturated polyester, polyvinyl acetate, copolymer of polyvinyl acetate, styrene butadiene rubber, polystyrene, and polymethylmethacrylate (PMMA).

An additive is optionally a free radical initiator such as peroxide/peroxy ketals and azo compounds. Illustrative examples of a peroxide/peroxy ketal include benzoyl peroxide, cyclohexanone peroxide, ditertiary butyl peroxide, dicumyl peroxide, tertiary butyl perbenzoate and 1,1-bis(t-butyl peroxy) 3,3,5-trimethylcyclohexane. A free radical initiator is optionally an azo compound. An azo compound is illustratively an isobutyronitrile such as t-butylazoisobutyronitrile and azobisisobutyronitrile. The thermoset free radical initiator alters the thermoset temperature such that the thermoset process does not occur until such a desired time or temperature. When present an initiator is optionally present at 0.1 to 3 percent by weight.

A polymerization inhibitor is optionally included in a material. A polymerization inhibitor is illustratively t-butyl catechol or hydroquinonone as typical examples. When present a polymerization inhibitor is commonly present from between zero and 1 percent by weight.

To increase the bulk, alter the density, or other desired parameter a non-conductive filler is optionally present. When present typical examples of non-conductive fillers include those commonly used in the art such as calcium carbonate, calcium silicate, alumina, alumina trihydrate (ATH), silica, talcs, dolomite, vermiculite, diatomaceous earth, kaolin clay, and combinations thereof. Typical sizes of a filler are from 0.1 to 50 micrometers in diameter. A filler is optionally a fiber filler with typical size of 5 to 50 millimeters. Examples of fiber fillers include glass, carbon, polyimides, polyesters, polyamides, and natural fibers such as cotton, silk, hemp, and combinations thereof.

Also provided is an article formed of a thermoset electromagnetic interference shielding material. Typical articles include cases, walls, substrates, or other articles that are shaped to protect an electronic device or other from EMI. An article is optionally an assembly of articles that are conductively interconnected such as by contact or via a conductive intermediate material. A conductive intermediate material is optionally the same or a different material as the remainder of the article.

A thermoset electromagnetic interference shielding material is made by intermixing a thermoset resin with a cross-linking agent along with a conductive material and an antisettling agent. The material is at or is brought to a temperature sufficient for curing. The material is optionally cured in a mold to the shape of an article.

Various aspects of the present invention are illustrated by the following non-limiting examples. The examples are for illustrative purposes and are not a limitation on any practice of the present invention. It will be understood that variations and modifications can be made without departing from the spirit and scope of the invention.

In an embodiment of thermoset electromagnetic interference shielding material, the shielding effectiveness of the inventive material ranges from 90 dB of attenuation at 1.0 GHz to 68 dB of attenuation at 10 GHz.

Various modifications of the present invention, in addition to those shown and described herein, will be apparent to those skilled in the art of the above description. Such modifications are also intended to fall within the scope of the appended claims.

It is appreciated that all component materials are obtainable by sources known in the art unless otherwise specified.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. An article formed with a thermoset electromagnetic interference shielding material said article comprising:
   a thermoset resin;
   a conductive material comprising a mixture of metallic or metallized spheres and metallic or metallized rods, said conductive material dispersed throughout said thermoset resin;
   an antisettling agent added to said thermoset resin, said thermoset resin, said conductive material and said antisettling agent cured in a mold to a shape of the article;
   wherein said article is resistant to fracture due to compressive forces that alter the conductive abilities of said article or that allow both ingress and egress of electromagnetic energy; and
   wherein said article is a case or wall with said conductive material homogenously dispersed throughout said article shaped into an enclosure to protect an electronic device from electromagnetic interference (EMI).

2. The article of claim 1 wherein said article is an assembly of a plurality of articles that are conductively interconnected by contact or via a conductive intermediate material.

3. The article of claim 2 wherein said conductive intermediate material is a different material as the remainder of the article.

4. The article of claim 1 wherein said article has a surface resistance of 50 ohms/sq or less.

5. The article of claim 1 wherein said antisettling agent is a rheology additive comprising a urea or a modified urea.

6. The article of claim 1 wherein said conductive material;
   wherein said metallic or metallized spheres are microballoons, plated glass spheres, or hollow microspheres coated with a metal, a conductive polymer, or combinations thereof;
   wherein said metal is copper, silver, nickel, aluminum or other metal with a bulk resistivity of $10^{-5}$ ohms/cm or less;
   wherein said metallic or metallized rods are sintered metal particles, metalized polymer fibers, metalized carbon fibers, or combinations thereof; and
   wherein said mixture of metallic or metallized spheres and metallic or metallized rods is homogenously dispersed throughout said thermoset resin.

7. The article of claim 1 wherein said thermoset electromagnetic interference shielding material has an electromagnetic interference (EMI) shielding effectiveness that ranges between 90 dB at 1 GHz and 68 db at 10 GHz.

* * * * *